United States Patent [19]

Ueda

[11] Patent Number: 5,053,698

[45] Date of Patent: Oct. 1, 1991

[54] TEST DEVICE AND METHOD FOR TESTING ELECTRONIC DEVICE AND SEMICONDUCTOR DEVICE HAVING THE TEST DEVICE

[75] Inventor: Koichiro Ueda, Kawasaki, Japan

[73] Assignee: Fujitsu Limited, Kawasaki, Japan

[21] Appl. No.: 424,042

[22] Filed: Oct. 19, 1989

[30] Foreign Application Priority Data

Oct. 28, 1988 [JP] Japan .................................. 63-272166

[51] Int. Cl.⁵ .......................................... G01R 31/28
[52] U.S. Cl. ................................ 324/158 R; 324/73.1; 371/21.4; 371/25.1
[58] Field of Search ........................ 324/158 R, 73.1; 371/25.1, 22.3, 22.5, 22.6, 21.2, 21.4; 365/201

[56] References Cited

U.S. PATENT DOCUMENTS 4,893,072  1/1990  Matsumoto .................. 371/25.1

FOREIGN PATENT DOCUMENTS 176892  6/1984  Japan .

Primary Examiner—Ernest F. Karlsen
Attorney, Agent, or Firm—Armstrong, Nikaido, Marmelstein, Kubovcik, & Murray

[57] ABSTRACT

A test device for an electronic device includes a pattern generating circuit, a plurality of comparators and a memory. The pattern generating circuit generates at least one input pattern. The electronic device under test is supplied with the input pattern and generating a corresponding ouput signal. The comparators are connected to the electronic device under test and are supplied with the output signal therefrom. The comparators compare the output signal with an expected output signal with mutually different timing of comparison. The memory stores the comparison results supplied from the comparators. Characteristics of the electronic device under test are obtained from the comparison results stored in the memory.

14 Claims, 8 Drawing Sheets

FIG. IA
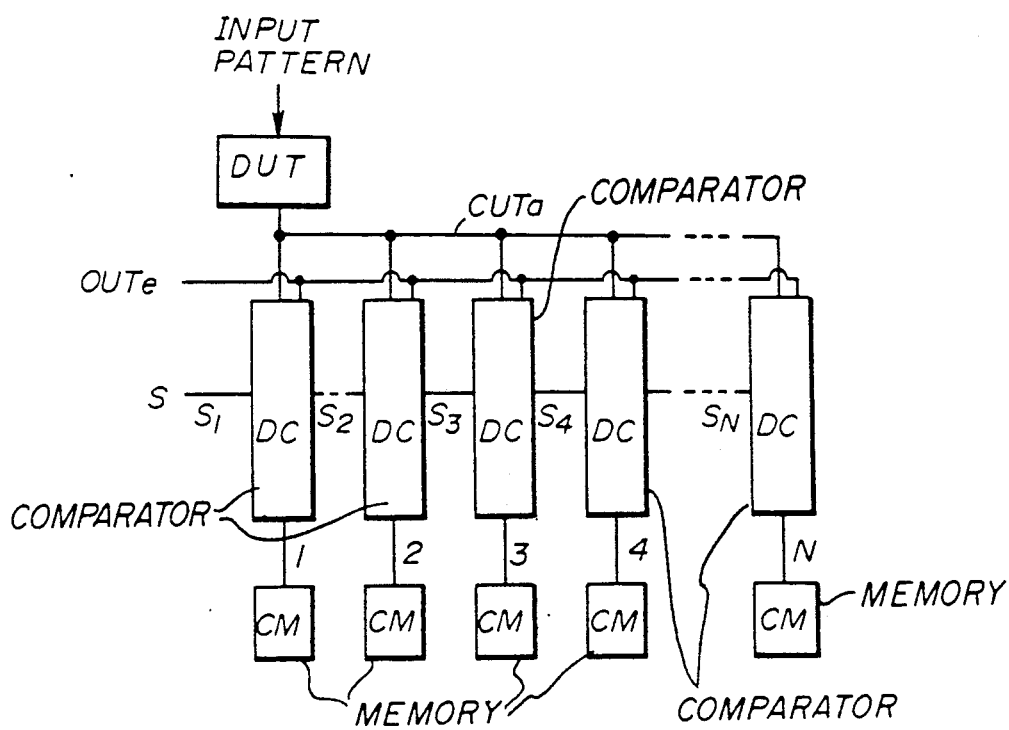
FIG. IB
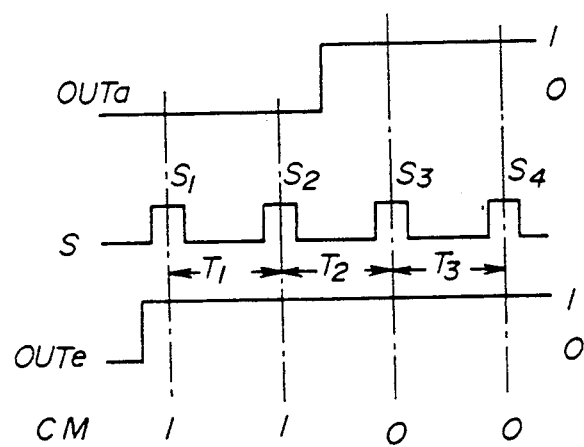

TEST DEVICE AND METHOD FOR TESTING ELECTRONIC DEVICE AND SEMICONDUCTOR DEVICE HAVING THE TEST DEVICE

BACKGROUND OF THE INVENTION

The present invention generally relates to a device for testing an electronic device, and more particularly to a test device suitable for measuring a propagation delay time of a device such as a semiconductor device and an intermittent change of an output signal. Further, the present invention relates to a method for testing an electronic device. Furthermore, the present invention relates to a semiconductor device having the test device.

Recently, a semiconductor device such as a memory device has a large capacity and operates at very high speed. Therefore, it takes a very long time to obtain data for evaluating performance of a semiconductor device. Generally, an input pattern corresponding to a test condition is supplied to a device to be tested, and it is determined whether the device under test is good or bad on the basis of output data derived therefrom. Then the test condition is altered and a corresponding input pattern is supplied to the device under test. In order to obtain data sufficient to evaluate the device under test, the above-mentioned procedure is repeatedly carried out.

The propagation delay time of a device is one of the most important factors particular in a memory device. The propagation delay time of a device is measured as follows. An input pattern is supplied to a device to be tested. It is noted that generally an input pattern is not used for measuring only the propagation delay time but used for measuring various characteristics of the device. Then it is determined whether the device under test is good or not. If the result is not good, the device under test is supplied with a different input pattern directed to obtaining the result of 'good'. Then it is determined whether the device under test is good or not. In this manner, different input patterns are repetitively supplied to the device under test, and the propagation delay time thereof is calculated on the basis of the results obtained for the respective test conditions (patterns). It can be seen from the above description that it takes a very long time to obtain the propagation delay time. Further, in order to find an intermittent change of the output signal derived from the device under test, different input patterns must repetitively be supplied thereto.

SUMMARY OF THE INVENTION

Accordingly, a general object of the present invention is to provide a test device for an electronic device in which the aforementioned disadvantages are eliminated.

A more specific object of the present invention is to provide a test device capable of measuring various characteristics of the device under test, especially a propagation delay time thereof by the use of a single input pattern so that test time is extremely reduced.

The above objects of the present invention can be achieved by a test device for an electronic device comprising a pattern generating device for generating at least one input pattern, the electronic device under test being supplied with the input pattern and generating a corresponding output signal, a plurality of comparators connected to the electronic device under test and supplied with the output signal therefrom, the comparators comparing the output signal with an expected output signal with mutually different timing of comparison, and a memory for storing the comparison results supplied from the comparators. Characteristics of the electronic device under test are obtained from the comparison results stored in the memory.

Another object of the present invention is to provide a method for testing an electronic device capable of measuring various characteristics of the device under test, especially a propagation delay time thereof by the use of a single input pattern so that test time is extremely reduced.

This object of the present invention can be achieved by a method of testing an electronic device comprising the steps of supplying the electronic device under test with at least one input pattern, the electronic device under test generating a corresponding output signal, comparing the output signal with an expected output signal for a plural number of times with mutually different timing of comparison, and storing the comparison results supplied with different timing in a memory. Characteristics of the electronic device under test being obtained from the comparison results stored in the memory.

Yet another object of the present invention is to provide a semiconductor device having the aforementioned test device.

This object of the present invention is achieved by a semiconductor device comprising a semiconductor chip, and a test device testing an electronic device. The test device includes a pattern generating device means for generating at least one input pattern, the electronic device under test being supplied with the input pattern and generating a corresponding output signal, a plurality of comparators connected to the electronic device under test and supplied with the output signal therefrom, the comparators comparing the output signal with an expected output signal with mutually different timing of comparison, and memory for storing the comparison results supplied from the comparators. Characteristics of the electronic device under test are obtained from the comparison results stored in the memory.

Additional objects, features and advantages of the present invention will become apparent from the following detailed description when read in conjunction with the accompanying drawings.

BRIEF DESCRIPTION OF THE DRAWINGS

FIG. 1A is a block diagram illustrating the principle of the present invention;

FIG. 1B is a waveform diagram of signals appearing at parts of the configuration shown in FIG. 1A;

DESCRIPTION OF THE PREFERRED EMBODIMENTS

Figure 2A:
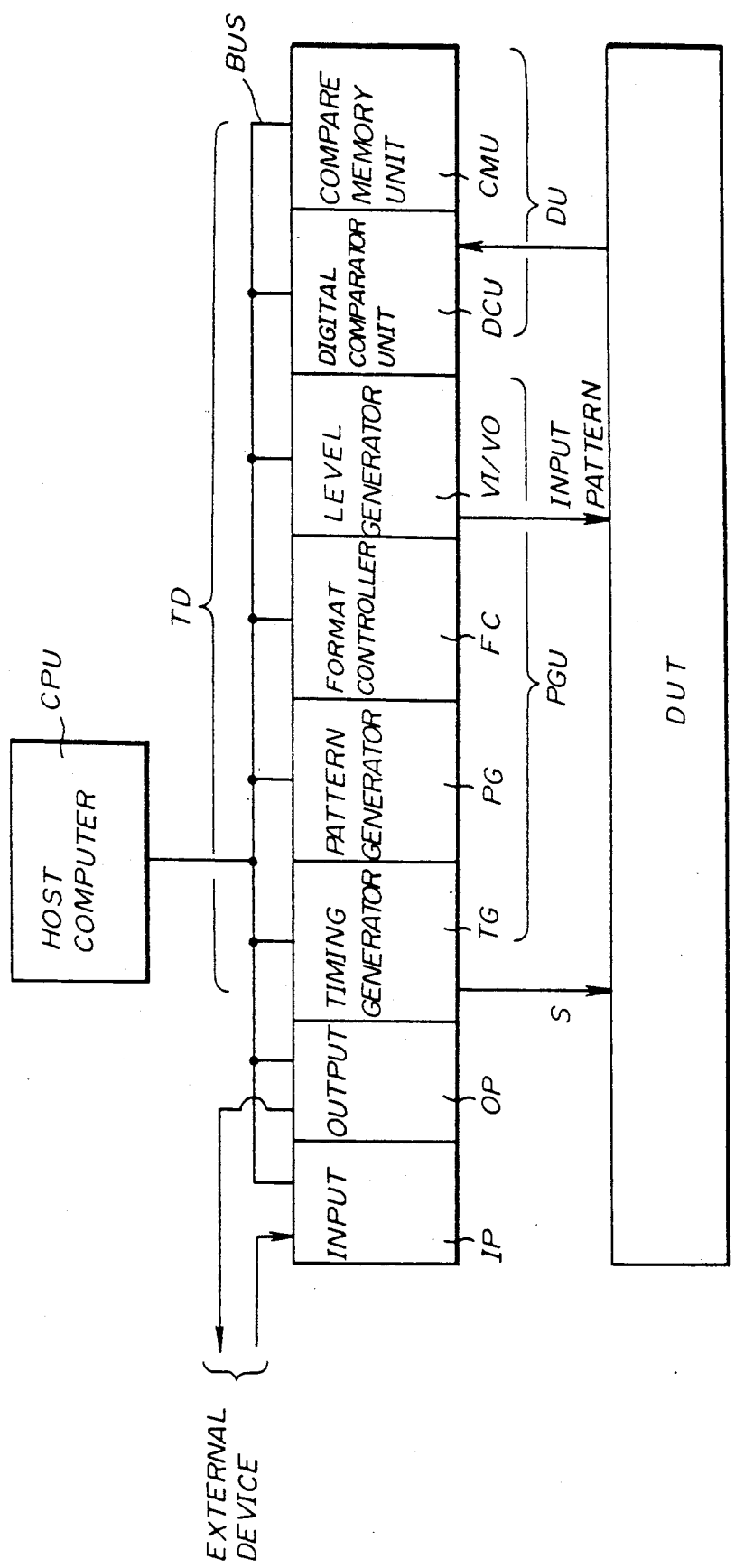
FIG. 2A is a block diagram of a test system including a test device according to the present invention.

A description is given of the principle of the present invention.

Referring to FIGS. 1A and 1B, an input pattern corresponding to a test condition is supplied to a device under test DUT. An output signal OUTa derived from the device DUT is supplied to N digital comparators DC. A reference output signal or expected output signal OUTe to be compared with the output signal OUTa is supplied to the N comparators DC. N compare memories CM are connected to the respective comparators DC. A strobe signal S is applied to the comparator 1 of the first stage. The comparator 1 compares the output signal OUTa with the expected output signal OUTe and outputs the comparison result when the strobe signal S is applied thereto. It is now assumed that the device DUT outputs a signal OUTa shown in FIG. 1B and the comparators DC are supplied with an expected output signal OUTe shown in FIG. 1B. The comparator 1 operates with timing of a strobe signal $S_1$ which is the strobe signal S applied thereto, and compares the output signal OUTa with the expected output signal OUTe. In the illustrated case, the output signal OUTa has a value different from that of the expected output signal OUTe. Therefore, a comparison result of '1' is stored in the memory CM associated with the comparator 1.

The comparator 2 is supplied with a strobe signal $S_2$ which lags behind the strobe signal $S_1$ by a time $T_1$. With timing of the strobe signal $S_2$, the comparator 2 compares the output signal OUTa with the expected output signal OUTe. In the illustrated case, the output signal OUTa has a value different from that of the expected output signal OUTe. Therefore, a comparison result of '1' is written into the memory CM associated with the comparator 2.

The comparator 3 is supplied with a strobe signal $S_3$ which lags behind the strobe signal $S_2$ by a time $T_2$. With timing of the strobe signal $S_3$, the comparator 3 compares the output signal OUTa with the expected output signal OUTe. In the illustrated case, the output signal OUTa has the same value as the expected output signal OUTe. Since a value of '0' is written beforehand in each of the memories, a value of '0' stored in the memory CM associated with the comparator 3 is held as it is. In other words, no data is written in the memory CM associated with the comparator 3.

The comparator 4 is supplied with a strobe signal $S_4$ which lags behind the strobe signal $S_3$ by a time $T_3$. With timing of the strobe signal $S_4$, the comparator 4 compares the output signal OUTa with the expected output signal OUTe. In the illustrated case, the output signal OUTa has the same value as the expected output signal OUTe. Therefore, a value of '0' stored in the memory CM associated with the comparator 4 is held as it is. In other words, no data is written in the memory CM associated with the comparator 4.

In this manner, the strobe signals $S_1, S_2, \ldots, SN$ are supplied to the respective comparators $1, 2, \ldots, N$, and the comparison results are stored in the respective memories CM. Therefore, it is possible to obtain the propagation delay time of the device DUT under test from the contents of the memories CM. In other words, the propagation delay time of the device DUT can be obtained using a single input pattern. From this viewpoint, the present invention is extremely effective to a case where a large number of devices is required to be tested for measuring the propagation delay time. It is noted that according to the conventional procedure, four comparison results for the strobe signals $S_1$-$S_4$ are obtained by independently supplying the device DUT with the same input pattern for four times.

The output signal OUTa is altered by changing the test condition (input pattern). For example, a time when the output signal OUTa changes from '0' to '1' appears prior to or behind the illustrated change. In this case, a corresponding expected output signal is supplied to the comparators DC. The contents of the memories CM may be read out for every test condition. Alternatively, the comparison results obtained for a series of different test conditions are stored in the memories CM, and read out together for decision making.

A description is given of a first embodiment of the present invention. Referring to FIG. 2A, there is illustrated a test system. The test system includes an input unit IP, an output unit OP, and a test device TD made up of a pattern generating unit PGU and a decision unit DU. The input unit IP is used for receiving a signal supplied from an external device (not shown), and the output unit OP is used for supplying the external device with a signal derived from the test system. The pattern generating unit PGU generates various input patterns and expected output signals (data), which are selectively supplied to the device DUT under test. A host computer such as a central processing unit (CPU) supplies, through a bus BUS, the pattern generating unit PGU with a test pattern which includes original data from which the various input patterns and expected output data are generated by the pattern generating unit PGU. The pattern generating unit PGU is made up of a timing generator TG, a pattern generator PG, a format controller FC, and a level generator VI/VO. The decision unit DU is made up of a digital comparator unit DCU and a compare memory unit CMU. The aforementioned elements are coupled to the bus BUS, to which the central processing unit (CPU) is coupled.

Figure 2B:
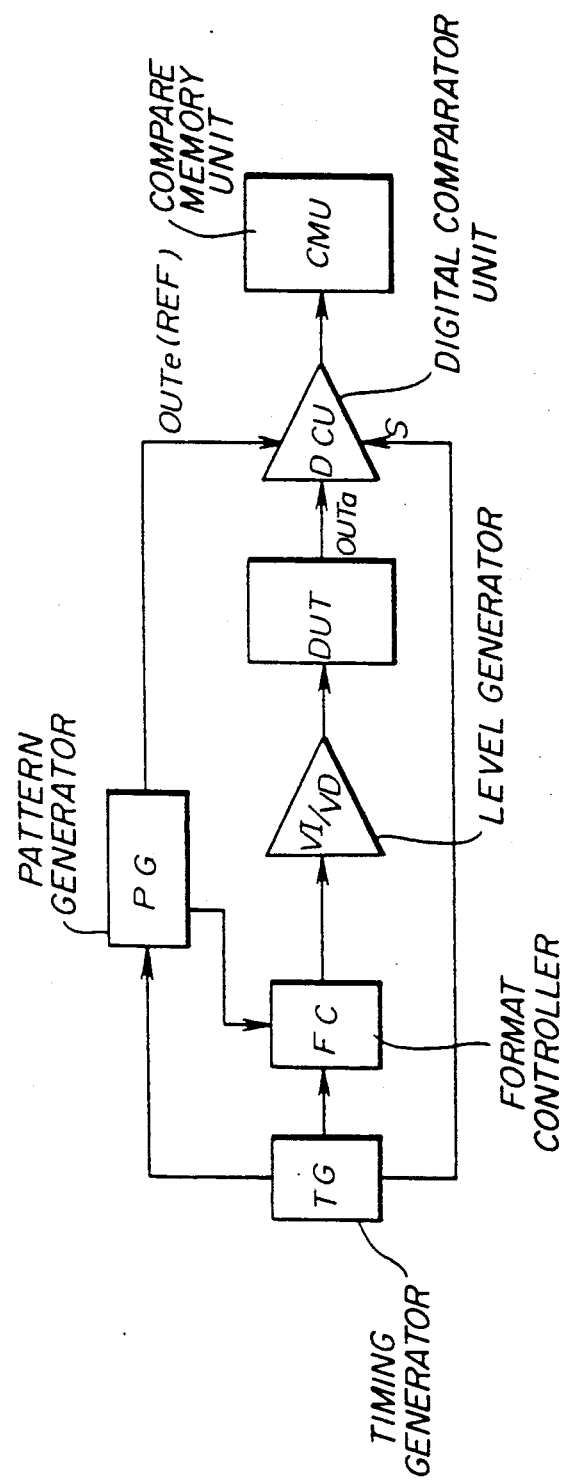
FIG. 2B is an equivalent block diagram of the configuration shown in FIG.2A.

The pattern generating unit PGU is equivalently configured as shown in FIG. 2B. The timing generator TG generates a first timing signal to be supplied to the pattern generator PG, and a second timing signal to be supplied to the comparator unit DCU. The second timing signal corresponds to the aforementioned strobe signal S supplied to the comparator 1 of the first stage shown in FIG. 1A. The pattern generator PG generates an input pattern from a test pattern supplied from the CPU in response to the first timing signal. The generated input pattern is supplied to the format controller FC, which generates a waveform signal (drive signal) for driving the device DUT under test. The level generator VI/VO serves as a driver for the device DUT, and defines levels of the driving signal (address signal in a case where the device DUT is a memory device). In the case where the device DUT is a TTL (transistor-transistor logic), the level generator VI/VO sets the low level to about 0V and the high level to about 3V. In the case where the device is an ECL (emitter coupled logic), the level generator VI/VO sets the low level to about −1.8V, and the high level to about −0.9V. The input pattern signal thus generated is supplied to the device DUT under test. In this manner, the pattern generator PG, the format controller FC and the level generator VI/VO can generate various input patterns and expected output signals from the test pattern supplied from the CPU. The expected output signals are selectively supplied to the digital comparator unit DCU through the bus BUS.

Figure 3:
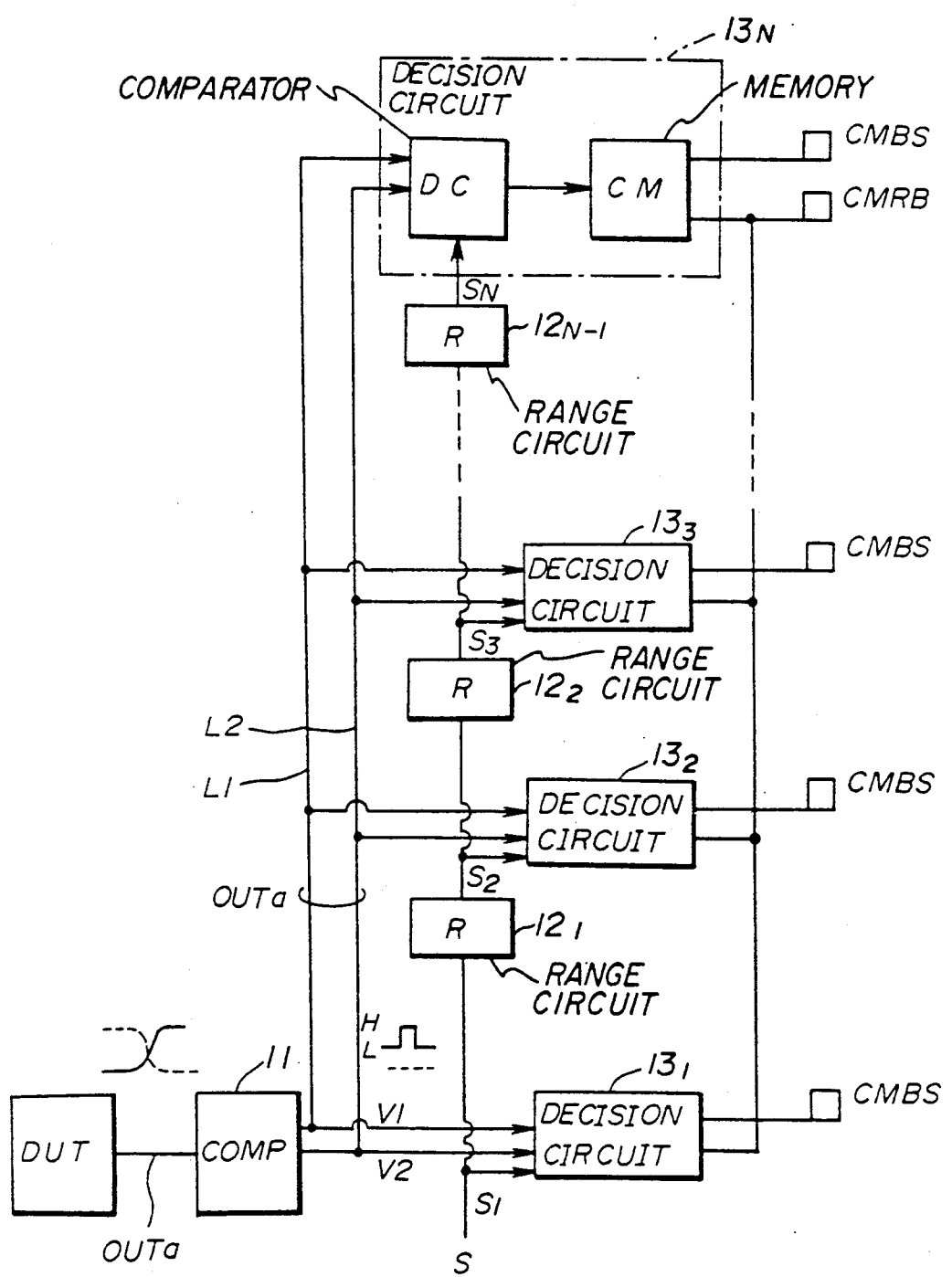
FIG. 3 is a block diagram of a decision unit shown in FIG. 2A.

FIG. 3 is a block diagram of the decision unit DU shown in FIG. 2A. Referring to FIG. 3, the decision unit DU is made up of a level comparator (COMP) 11, N-1 range circuits (R) $12_1$, $12_2$, ..., $12_{N-1}$, and N decision circuits $13_1$, $13_2$, ..., $13_N$. The level comparator 11 determines whether the output signal OUTa supplied from the device DUT under test is the low level or high level. In case where the device DUT is directly connected to the decision circuits $13_1$, $13_2$, ..., $13_N$, a load condition at the output of the device DUT is changed. In this case, it is difficult to test the device DUT correctly The presence of the level comparator 11 prevents this problem. It is noted that the decision circuits $13_1$–$13_N$ require only level information of the output signal OUTa.

Figure 4A:
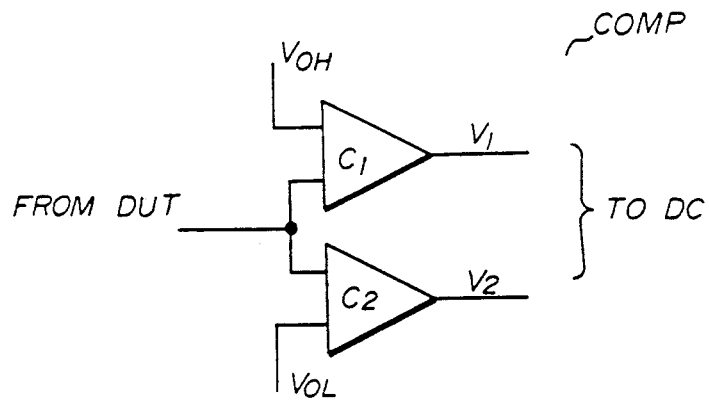
FIG. 4A is a circuit diagram of a level comparator shown in FIG. 3.

FIG. 4A is a circuit diagram of the level comparator 11. As is illustrated, the level comparator 11 is composed of comparators C1 and C2, which are supplied with a high-level reference voltage $V_{OH}$ and a low-level reference voltage $V_{OL}$, respectively. When the output signal OUTa supplied from the device DUT is equal to or larger than the reference voltage $V_{OH}$, V1 = V2 = H (high level) where V1 and V2 are output voltages of the comparators C1 and C2, respectively. When the output signal OUTa is equal to or lower than the reference voltage $V_{OL}$, V1 = V2 = L. When the output signal OUTa exists between $V_{OH}$ and $V_{OL}$, V1 = L and V2 = H.

Figure 5A:
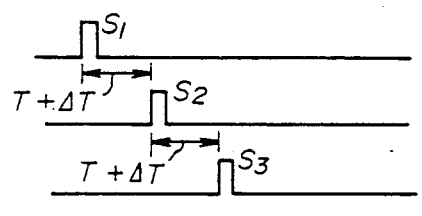
FIG. 5A is a waveform diagram illustrating an operation of the range circuits.

The two output signals V1 and V2 are supplied to each of the decision circuits $13_1$–$13_N$ through signal lines L1 and L2, respectively. The strobe signal S generated by the timing generator TG shown in FIGS. 2A and 2B is supplied directly to the decision circuit $13_1$ and the range circuit $12_1$. The range circuits $12_1$–$12_{N-1}$ are connected in series and supplies the decision circuits $13_2$, $13_3$, ..., $13_N$ with respective delayed strobe signals $S_2$, $S_3$, ..., $S_N$. As described previously, the range circuits $12_1$–$12_{N-1}$ have respective delay times $T_1$, $T_2$, ..., $T_{N-1}$. For example, each of the delay times $T_1$, $T_2$, ..., $T_{N-1}$ is set equal to T. Preferably, a delay time $\Delta T$ is added to the delay time T because the output signal OUTa does not arrive at the decision circuits $13_1$–$13_N$ at the same time due to a propagation delay of each of the signal lines L1 and L2. The delay time $\Delta T$ is used for compensating the propagation delay. FIG. 5A is a waveform diagram of the strobe signals $S_1$, $S_2$ and $S_3$.

Figure 4B:
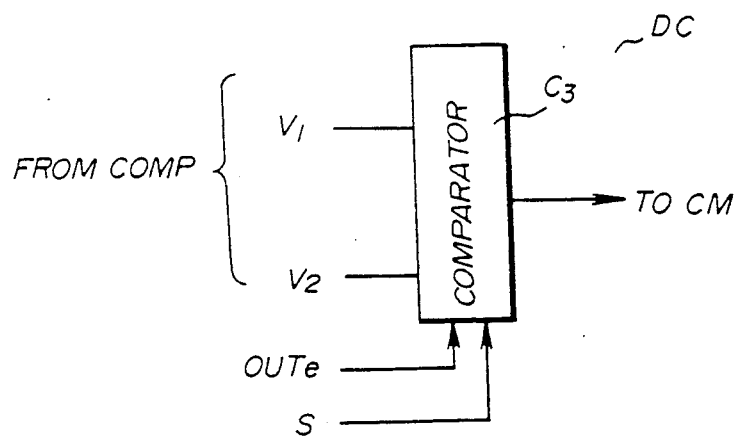
FIG. 4B is a block diagram of a digital comparator shown in FIG. 3.
Figure 4C:
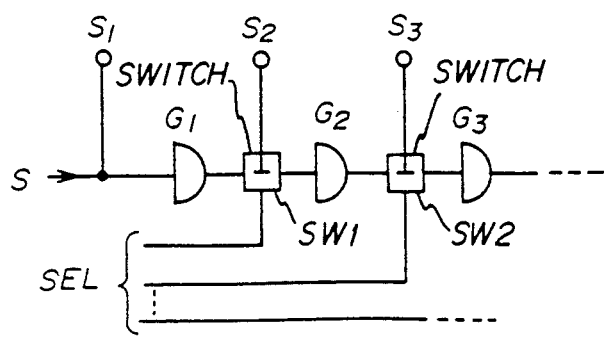
FIG. 4C is a circuit diagram of range circuits shown in FIG. 3.

FIG. 4C is a circuit diagram of the range circuits $12_1$ and $12_2$. The range circuit $12_1$ is made up of a gate G1 serving as a delay element, and a switch SW1 for drawing the output signal of the gate G1. The switch SW1 is controlled by a corresponding bit of a select signal SEL, which is supplied from the CPU shown in FIG. 2A. When the corresponding bit of the select signal SEL is applied to the switch SW1, it outputs the strobe signal S2, which is to be applied to the decision circuit $13_2$.

The range circuit $12_2$ is formed by a gate G2 and a switch SW2 in the same manner as the range circuit $12_1$. The strobe signal S2 drawn from the switch SW2 has a delay time provided by the gates G1 and G2. The other range circuits $12_3$–$12_{N-1}$ are configured in the same manner.

Figure 5B:
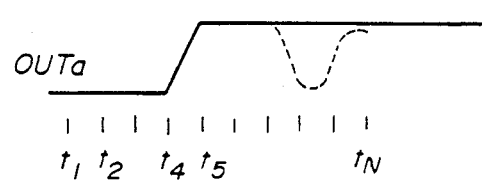
FIG. 5B is a waveform diagram illustrating detection of an intermittent change of an output signal supplied from a device under test.

Each of the decision circuits $13_1$–$13_N$ is made up of the digital comparator DC and the compare memory CM. FIG. 4B is a circuit diagram of the digital comparator DC. The digital comparator DC includes a comparator C3 formed by an exclusive OR gate having a latch function, for example. The comparator C3 is supplied with the corresponding strobe signal S, the corresponding expected output signal OUTe supplied from the CPU, and the voltage signals V1 and V2 which are supplied, as the output signal OUTa, through the signal lines L1 and L2, respectively. When the strobe signal S is supplied to the comparator C3, it determines whether the level of the output signal OUTa defined by the voltages V1 and V2 is equal to the corresponding expected output signal OUTe, and outputs the comparison result to the corresponding memory CM. That is, as shown in FIG. 5B, the decision circuits $13_1$–$13_N$ make a H/L decision at times $t_1$, $t_2$, ..., $t_N$.

The memories CM of the decision circuits $13_1$–$13_N$ are formed by a one-word x N-bit memory, for example. One word corresponds to one address. The comparison results derived from the comparators C3 are stored in the respective one-bit areas of the memory. Initially, the contents of the N one-bit areas are set to '0' by the CPU shown in FIG. 2A. When the output signal OUTa is identical to the corresponding expected output signal OUTe at a time, no information is written into the corresponding one-bit area. On the other hand, when the output signal OUTa is different from the expected output signal OUTe at a time, a value '1' is written into the corresponding one-bit area. After completing test by the use of the single input pattern, the contents of the memories CM of the decision circuits $13_1$–$13_N$ are read out as a signal CMRB in response to respective select signals CMBS. The propagation delay time of the device DUT can be obtained on the basis of the signal CMRB.

It is noted that precision or resolution in measurement is based on the value of the delay time T. That is, when the delay time T is set small, the resolution is high. On the other hand, when the delay time T is set large, the resolution is low. Using the test results, it is possible to obtain not only the propagation delay time of the device DUT but also an abnormal intermittent change of the output signal OUTa as illustrated by a dotted line shown in FIG. 5B. If a series of correct results is 00011111..., the results read out from the memories CM of the decision circuits $13_1$–$13_N$ may be 0000111001..., for example.

Figure 5E:
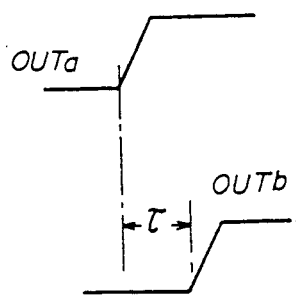
FIG. 5E is a waveform diagram of output signals for different input patterns.
Figure 6:
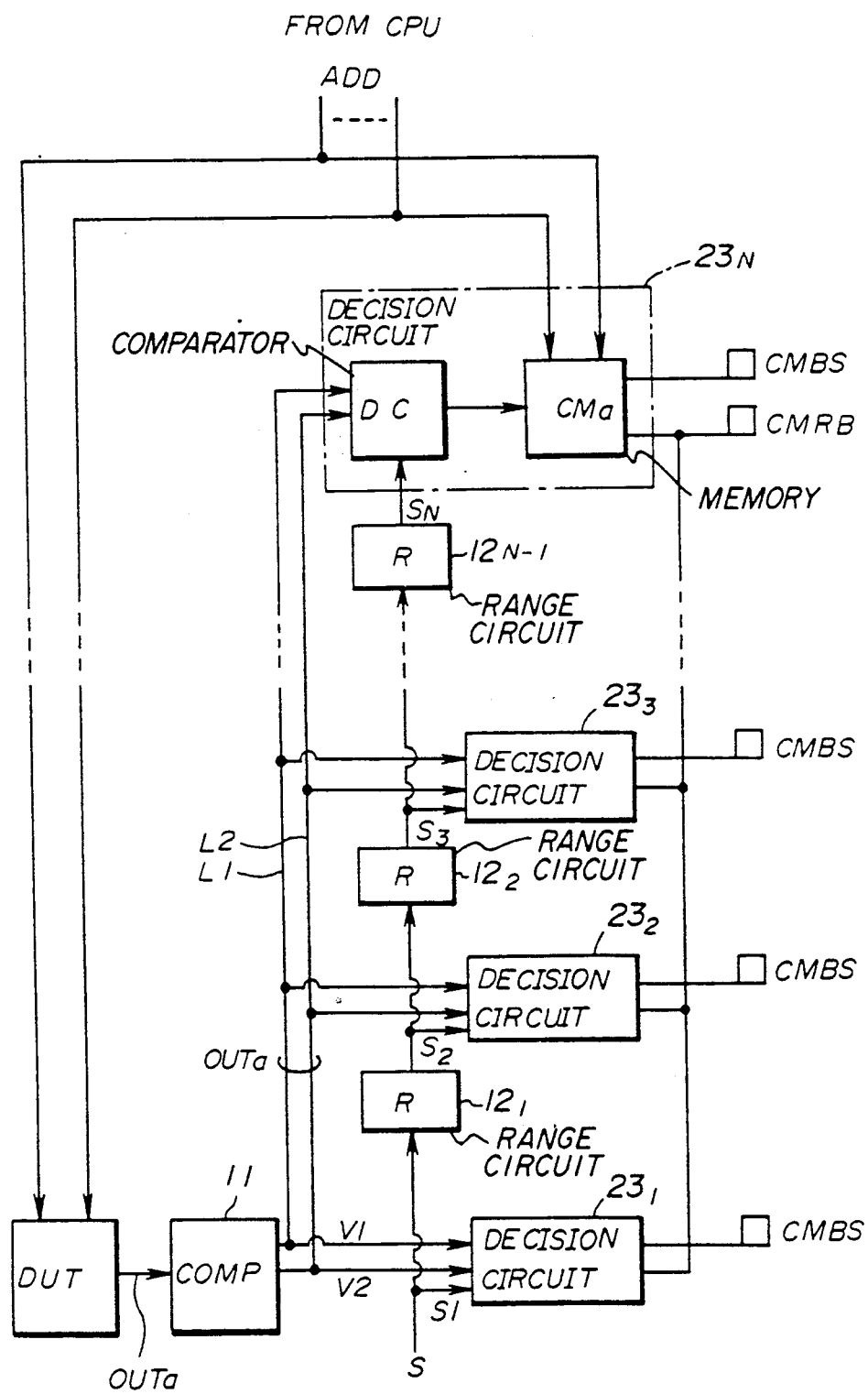
FIG. 6 is a block diagram of a decision unit according to the second embodiment of the present invention.

A description is given of a second embodiment of the present invention with reference to FIG. 6. The second embodiment is designed to store test results with respect to a plurality of different input patterns generated by the pattern generator PG shown in FIGS. 3A and 3B. As shown in FIG. 5E, when a test condition different from that for the output signal OUTa is set, the device DUT under test may output a signal OUTb, which lags behind the output signal OUTa by a timer. The second embodiment is suitable for a case where the device DUT under test is a memory device. The second embodiment includes N decision circuits $23_1$–$23_N$, each of which is made up of the aforementioned digital comparator DC and a compare memory CMa. The memories CMa are formed by a memory having a capacity equal to M words × N bits where M is an arbitrary integral. That is, each of the memories CMa can store the one-bit comparison results for M different input patterns.

Figure 5C:
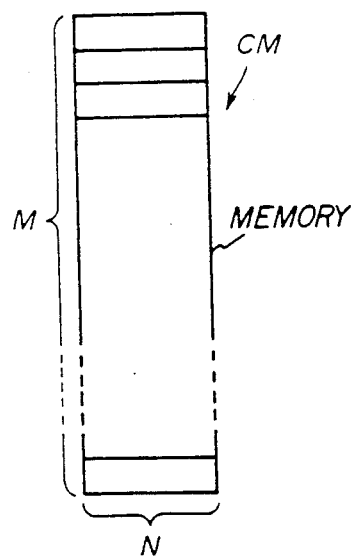
FIG. 5C is a storage format of a memory used in a second embodiment.

FIG. 5C illustrates a storage area of a memory having a capacity of MxN bits which forms the memories CMa of the decision circuits $23_1$-$23_N$. An address signal ADD which is supplied to the memories CMa from the CPU is selected so as to be identical to an address for the device DUT under test. The address signal ADD is set in a test program controlled by the CPU. When an input pattern corresponding to a value of the address signal ADD is supplied to the device DUT under test, the comparison results are written into a corresponding one-word area consisting of N bits. When a different input pattern is supplied to the device DUT, the comparison results are written into a corresponding one-word area.

Figure 5D:
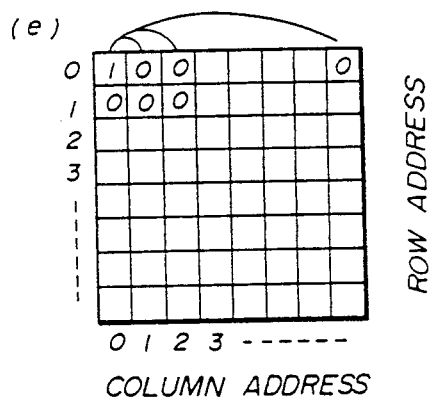
FIG. 5D is an example of data stored in the memory.

A description is given of examples of input patterns which are used in the case where the device DUT under test is a memory. In a conventional test called SCAN, the following write/read operation is carried out: W00, W10, ..., Wn0, R00, R10, ..., Rn0, W01, W11, ..., Wn1, R01, R11, ..., Rn1, where Wi0 and Wi1 indicate writing of data '0' and '1' for an address i (i=0−n), respectively, and Ri0 and Ri1 indicate reading of data '0' and '1', respectively. In another SCAN test called "strip", the following write/read operation is carried out: W00, W11, W20, ..., R00, R11, R20, ..., W01, W10, W21, ..., R01, R10, R21, .... In a test called "pingpong", as shown in FIG. 5D, data '1' is written in area (0, 0) of the memory where the first figure indicates a row address and the second figure indicates a column address. Next, data '0' in area (0, 1) is read, and data '1' is written into the same area. Then data '0' is read and data '1' is written into the same area. Such a procedure is repeatedly performed.

Figure 7:
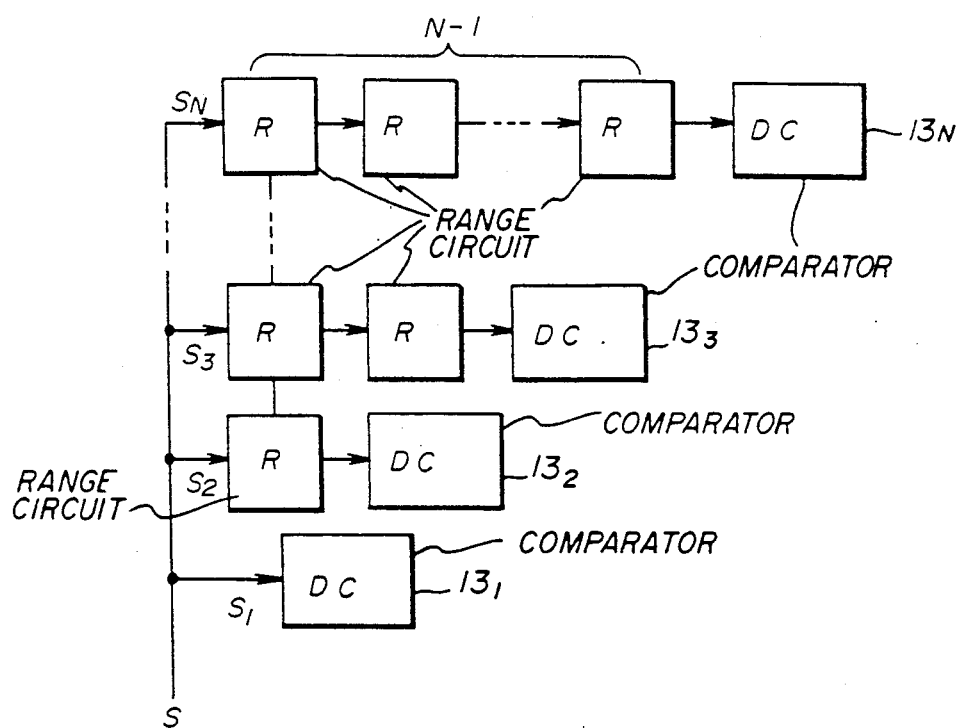
FIG. 7 is a circuit diagram of an alternative arrangement of range circuits.

FIG. 7 is a circuit diagram of an alternative configuration of the range circuit arrangement. The illustrated arrangement includes series circuits each including a specific number of range circuits. For example, a series circuit for the decision circuit $13_N$ includes N−1 range circuits.

The test device TD can be formed on a semiconductor chip so that a semiconductor device having the test device TD can be formed.

The present invention is not limited to the aforementioned embodiments, and variations and modifications may be made without departing from the scope of the present invention.

What is claimed is:

1. A test device for an electronic device, comprising:
   pattern generating means for generating at least one input pattern, said electronic device under test supplied with said input pattern and said electronic device under test generating a corresponding output signal;
   a plurality of comparators in parallel connected to said electronic device under test and supplied with said output signal therefrom, said plurality of comparators comparing said output signal with an expected output signal at mutually different timings of comparison; and
   memory means for storing comparison results supplied from said plurality of comparators, wherein characteristics of said electronic device under test obtained from comparison results stored in said memory means.

2. A test device as claimed in claim 1, further comprising means for generating a strobe signal, and delay means for delaying said strobe signal and generating a plurality of delayed strobe signals which are supplied to said respective comparators, wherein said comparators compares said output signal with said expected value when the corresponding one of said strobe signals is supplied.

3. A test device as claimed in claim 2, wherein said delay means includes a plurality of delay circuits which are connected in series, and said strobe signal generated by said means is applied to the delay circuit of the first stage.

4. A test device as claimed in claim 2, wherein said delay means includes a plurality of delay lines coupled to said respective comparators, and each of said plurality of delay lines includes a specific different number of delay circuits having the same delay time.

5. A test device as claimed in claim 3, wherein each of said delay circuits includes a delay element, and a switch connected to said delay element and drawing the delayed strobe signal supplied therefrom.

6. A test device as claimed in claim 1, further comprising level comparator means, coupled between said electronic device under test and said plurality of comparators, for comparing a level of said output signal supplied from said electronic device under test with predetermined levels and for determining whether said output signal from said electronic device is at a high level or a low level.

7. A test device as claimed in claim 6, wherein said level comparator means includes a first comparator comparing said output signal supplied from said electronic device under test with a high-level reference voltage and outputting a first voltage indicative of a comparison result, and a second comparator comparing said output signal supplied from said electronic device under test with a low-level reference voltage and outputting a second voltage indicative of a comparison result, and wherein said first and second voltages are supplied, as said output signal from said electronic device under test, to said plurality of comparators.

8. A test device as claimed in claim 7, wherein each of said plurality of comparators compares the level of said output signal defined by said first and second voltages with the expected output signal.

9. A test device as claimed in claim 2, wherein said electronic device under test is coupled to said plurality of comparators through a signal line, and wherein said delay time of each of said delayed strobe signals includes a propagation delay time caused by said signal line.

10. A test device as claimed in claim 1, wherein said pattern generating means generates a plurality of different input patterns, and said memory means has a storage capacity which enables said memory means it to be possible to store the comparison results for said different input patterns.

11. A test device as claimed in claim 10, wherein said memory means includes a memory having said storage capacity, and said electronic device under test is a memory device, and wherein said test device further comprises address generating means for generating an address signal to be supplied to said memory and said electronic device under test, and said input patterns correspond to values of said address signal derived from said address generating means.

12. A test device as claimed in claim 11, wherein said memory means and said device under test are supplied with a same address signal derived from said address generating means.

13. A method of testing an electronic device comprising the steps of:
supplying said electronic device under test with at least one input pattern, said electronic device under test generating a corresponding output signal;
comparing said output signal with an expected output signal for a plural number of times at mutually different timings of comparison;
storing the comparison results supplied with different timing in a memory and
obtaining characteristics of said electronic device under test obtaining from the comparison results stored in said memory.

14. A semiconductor device comprising:
a semiconductor chip; and
a test device testing an electronic device, said test device including
pattern generating means for generating at least one input pattern, said electronic device under test supplied with said at least one input pattern and generating a corresponding output signal,
a plurality of comparators in parallel connected to said electronic device under test and supplied with said output signal therefrom, said plurality of comparators comparing said output signal with an expected output signal at mutually different timings of comparison, and
memory means for storing comparison results supplied from said plurality of comparators,
wherein characteristics of said electronic device under test obtained from comparison results stored in said memory means.

* * * * *